(12) United States Patent
Shen et al.

(10) Patent No.: US 7,682,864 B2
(45) Date of Patent: Mar. 23, 2010

(54) METHOD FOR FABRICATING ORGANIC ELECTROLUMINESCENT DEVICE

(75) Inventors: Wen-Jian Shen, Taoyuan County (TW); Yi-Lung Kao, Taoyuan County (TW); Shuenn-Jiun Tang, Hsinchu County (TW); Chih-Kwang Tzen, Pingtung County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 556 days.

(21) Appl. No.: 11/308,884

(22) Filed: May 22, 2006

(65) Prior Publication Data
US 2007/0128346 A1 Jun. 7, 2007

(30) Foreign Application Priority Data
Dec. 2, 2005 (TW) ............................... 94142426 A

(51) Int. Cl.
*H01L 21/00* (2006.01)
(52) U.S. Cl. .................. 438/82; 257/E51.038; 427/384

(58) Field of Classification Search ............ 438/82; 257/E51.038
See application file for complete search history.

(56) References Cited

U.S. PATENT DOCUMENTS

| 6,208,075 B1 | 3/2001 | Hung et al. ................. 313/504 |
| 6,208,077 B1 | 3/2001 | Hung .......................... 313/506 |
| 2005/0162075 A1 | 7/2005 | Madathil et al. ............ 313/504 |

*Primary Examiner*—Lex Malsawma
(74) *Attorney, Agent, or Firm*—Jianq Chyun IP Office

(57) ABSTRACT

A method for fabricating an organic electroluminescent device (OLED) includes the following steps. First, a substrate is provided. Next, an anode layer is formed on the substrate. Next, a buffer layer is formed on the anode layer, wherein the buffer layer include a $CF_x$ film (fluorinated carbon films) containing carbon-fluoride bonded molecules. Next, a treatment process is performed on the $CF_x$ film to convert the carbon-fluoride bonded molecules into carbon-carbon bonded molecules. A plurality of organic layers is formed on the buffer layer. A cathode layer is formed on the organic layer. Because the buffer layer has a better conductivity, the organic electroluminescent device (OLED) of the present invention has a better luminous efficiency.

17 Claims, 6 Drawing Sheets

METHOD FOR FABRICATING ORGANIC ELECTROLUMINESCENT DEVICE

CROSS-REFERENCE TO RELATED APPLICATION

This application claims the priority benefit of Taiwan application serial no. 94142426, filed on Dec. 2, 2005. All disclosure of the Taiwan application is incorporated herein by reference.

BACKGROUND OF THE INVENTION

1. Field of the Invention

The present invention relates to a method for fabricating an organic electroluminescent device (OLED), and more particularly to a method for fabricating a carbon-enriched film with high conductivity and a method for fabricating an organic electroluminescent device (OLED) employing the carbon-enriched film as the buffer layer thereof.

2. Description of the Related Art

Display serving as an interface between human and information plays a significant role in everyday activities. Currently flat panel displays have become the major trend in the display field. Wherein in particular, an organic electroluminescent display has enormous potential and is expected to become the main stream of the next generation flat panel displays, thanks to its predominant advantageous features, such as self-emitting, no viewing angle dependency, power-saving, simpler process, low-cost, lower operation temperature range, fast response and full colorization.

An organic electroluminescent display mainly takes advantage of the self-emitting nature of an organic electroluminescent device (OLED) to achieve displaying effect. Wherein, the organic electroluminescent display mainly comprises a pair of electrodes and an organic layer. When current flows between the anode and the cathode, electrons and holes in the organic layer are recombined to produce excitons and enables the organic layer to produce lights with different colors depending on the material property of the organic layer. Thus, a luminous display is achieved.

FIG. 1 is a schematic view of a structure of a conventional organic electroluminescent device (OLED). Referring to FIG. 1, a conventional OLED 100 includes a substrate 110, an anode layer 120, a hole transporting layer (HTL) 130, an organic electroluminescent layer (OEL) 140, an electron transporting layer (ETL) 150 and a cathode layer 160. As an offset voltage is applied between the anode layer 120 and the cathode layer 160, electrons are injected into the electron transporting layer (ETL) 150 from the cathode layer 160 and are transmitted to the organic electroluminescent layer (OEL) 140, while holes are injected into the hole transporting layer (HTL) 130 from the anode layer 120. Further, the injected holes are transmitted to the organic electroluminescent layer (OEL) 140, where the electrons and the holes are recombined to generate excitons and produce luminous effect.

The anode layer 120 is typically comprised of an indium tin oxide (ITO) material, and therefore the contact interface between the ITO (an inorganic material) and the hole transporting layer (HTL) 130 (an organic material) has a poor electrical contact. In order to resolve the above problem some proposed suppressing the switching current by treating the surface of the ITO anode layer with an UV-ozone and a plasma. However, exposure of the surface of the anode layer 120 to the UV-ozone and plasma may damaged the surface of the anode layer 120, which may adversely affect electrical properties of the anode layer 120.

Some others propose disposing a buffer layer (not shown) between the anode layer 120 and the hole transporting layer (HTL) 130. However the conductivity of the buffer layer is poor, which lower the luminous efficiency of the organic electroluminescent device (OLED) 100.

SUMMARY OF THE INVENTION

Accordingly, an object of the present invention is to provide a method for fabricating an organic electroluminescent device (OLED) suitable for fabricating an organic electroluminescent display device having better luminous efficiency.

Another object of the present invention is to provide a method for fabricating a carbon-enriched film with high conductivity suitable for serving as a hole injection layer (HIL) and a hole transporting layer (HTL) in an OLED and thereby further improving the OLED luminous efficiency.

According to an embodiment of the present invention, first, a substrate is provided. Next, an anode layer is formed over the substrate. Next, a buffer layer is formed over the anode layer, wherein the buffer layer is formed by, for example, forming a $CF_x$ film (fluorinated carbon film) containing carbon-fluoride bonded molecules on the anode layer and performing a treatment process to treat the $CF_x$ film (fluorinated carbon film) for converting the carbon-fluoride bonded molecules into carbon-carbon bonded molecules. Furthermore, a plurality of organic layers is formed on the buffer layer. Finally, a cathode layer is formed on the organic layer.

In an embodiment of the present invention, the treatment process includes at least an ultraviolet irradiation process or a plasma treatment process.

In an embodiment of the present invention, the ultraviolet irradiation process employs an ultraviolet light with a wavelength of about 180 nm~260 nm, preferably with a wavelength of about 185 nm or 254 nm.

In an embodiment of the present invention, the ultraviolet irradiation process employs an ultraviolet light with a light intensity of about 270 mJ/cm²~810 mJ/cm², preferably a light intensity of about 270 mJ/cm² or 810 mJ/cm².

In an embodiment of the present invention, the plasma treatment process utilizes employs a gas containing argon (Ar) or nitrogen ($N_2$).

In an embodiment of the present invention, the carbon-fluoride bonded molecule includes one of $CF_1$ (carbon unifluoride bonded molecule), $CF_2$ (carbon bifluoride bonded molecule), $CF_3$ (carbon trifluoride bonded molecule), C—$CF_n$ (carbon-carbon n-fluoride bonded molecule) and a combination thereof.

In an embodiment of the present invention, the $CF_x$ film may be formed by performing, for example, a plasma chemical vapor deposition (plasma CVD) process.

In an embodiment of the present invention, the buffer layer can be used to serve as a hole injection layer (HIL) and a hole transporting layer (HTL).

In an embodiment of the present invention, the organic layer may be formed by, for example, sequentially forming a hole transporting layer (HTL), an organic electroluminescent layer (OEL), an electron transporting layer (ETL) and forming an electron injection layer (EIL) over the buffer layer.

In an embodiment of the present invention, the hole transporting layer (HTL) includes NPB (8-naphylhenyidiamine).

In an embodiment of the present invention, the a organic electroluminescent layer (OEL) includes a blended luminescence material doped with $AlQ_3$ (aluminum tris (8-hydroxyquinoline)).

In an embodiment of the present invention, the electron transporting layer (ETL) includes $AlQ_3$ (aluminum tris (8-hydroxyquinoline)).

In an embodiment of the present invention, the electron injection layer (EIL) includes LiF (lithium fluoride).

In an embodiment of the present invention, the anode layer includes metal or transparent conductive material.

In an embodiment of the present invention, the cathode layer includes metal or transparent conductive material.

The present invention further provides a method for fabricating a carbon-enriched film including the following steps. First, a substrate is provided. Next, a $CF_x$ film (fluorinated carbon film) is formed on the substrate, wherein the $CF_x$ film contains carbon-fluoride bonded molecules. Next, a treatment process is performed on the $CF_x$ film so as to convert the carbon-fluoride bonded molecules into carbon-carbon bonded molecules.

In an embodiment of the present invention, the treatment process includes an ultraviolet irradiation process or a plasma treatment process.

In an embodiment of the present invention, the ultraviolet irradiation process employs an ultraviolet light with a wavelength of about 180 nm~260 nm, preferably about 185 nm or 254 nm.

In an embodiment of the present invention, the ultraviolet irradiation process employs an ultraviolet light with a light intensity of about 270 mJ/cm$^2$~810 mJ/cm$^2$, preferably 270 mJ/cm$^2$ or 810 mJ/cm$^2$.

In an embodiment of the present invention, the plasma treatment process employs a gas containing argon (Ar) or nitrogen ($N_2$).

In an embodiment of the present invention, the carbon-fluoride bonded molecule includes one of $CF_1$ (carbon unifluoride bonded molecule), $CF_2$ (carbon bifluoride bonded molecule), $CF_3$ (carbon trifluoride bonded molecule), C—$CF_n$ (carbon-carbon n-fluoride bonded molecule) and a combination thereof.

In an embodiment of the present invention, the $CF_x$ film may be formed by performing, for example, plasma chemical vapor deposition (plasma CVD) process.

The present invention employs a treatment process to convert the carbon-fluoride bonded molecules in the $CF_x$ film into carbon-carbon bonded molecules for producing a carbon-enriched film for improving the electrical conductivity and the thermal stability. Furthermore, the carbon-enriched film is disposed between the anode layer and the hole transporting layer (HTL) in the organic electroluminescent device (OLED) to improve the interface property between the anode layer and the HTL and thereby substantially improve luminous efficiency and brightness of the OLED device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

FIG. 2A~FIG. 2F are schematic cross-sectional views showing a method flowchart for fabricating an organic electroluminescent device (OLED) according to an embodiment of the present invention.

Figure 1:
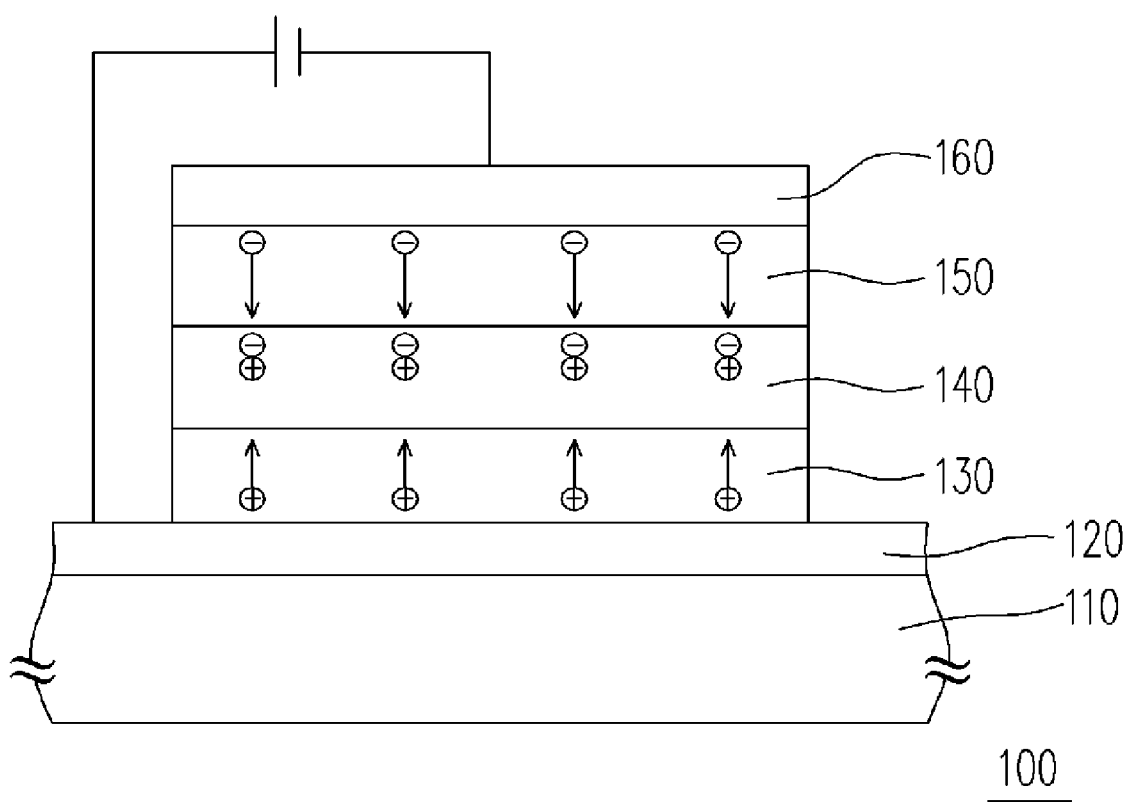
FIG. 1 is a schematic view of a structure of a conventional organic electroluminescent device (OLED).
Figure 2A:
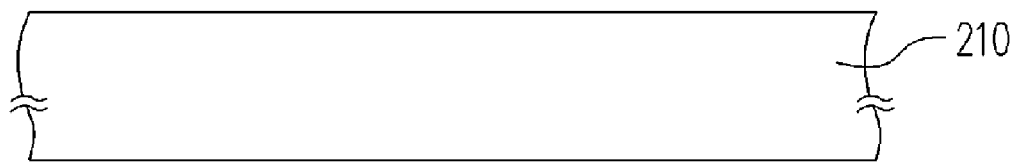
FIG. 2A~FIG. 2F are schematic cross-sectional views showing a method flowchart for fabricating an organic electroluminescent device (OLED) according to an embodiment of the present invention.

First, a substrate 210 is provided, as shown in FIG. 2A. In an embodiment, the substrate 210 may be a glass substrate, a plastic substrate or a flexible substrate.

Figure 2B:
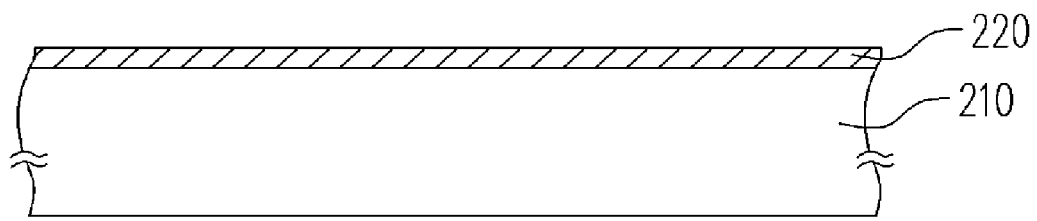

Next, as shown in FIG. 2B, an anode layer 220 is formed on the substrate 210. In an embodiment, the anode layer 220 may be formed by performing a sputtering or evaporation process. The anode layer 220 comprises metal or transparent conductive material including, for example, indium tin oxide (ITO), tin oxide, gold, silver, platinum or copper.

Figure 2C:
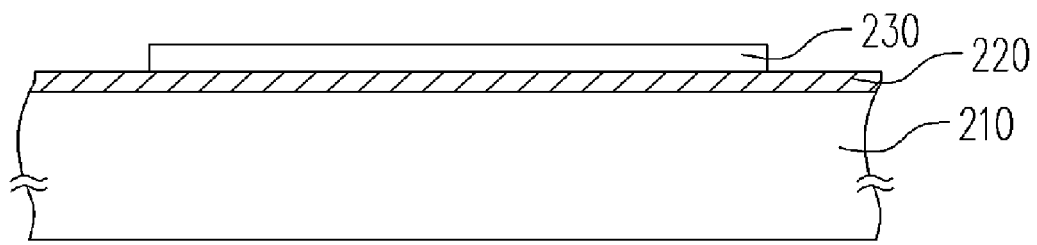
Figure 2D:
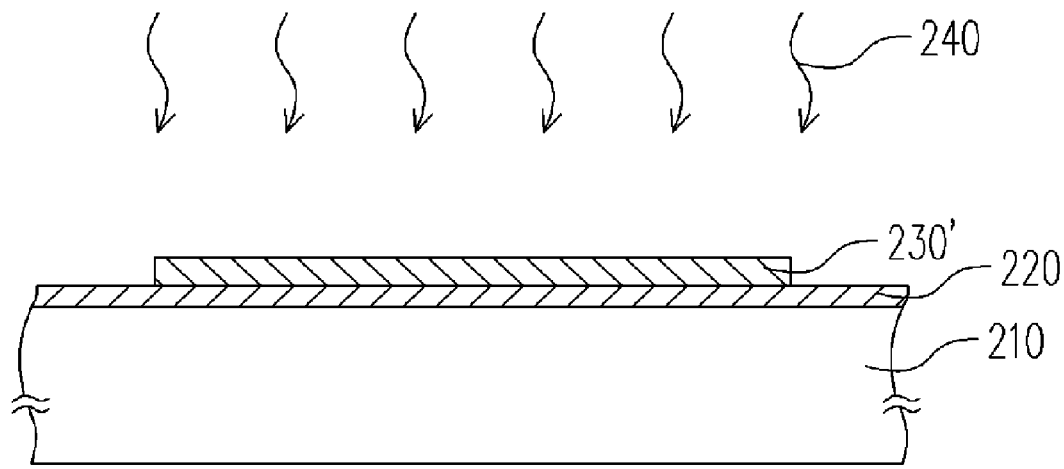

Next, as shown in FIGS. 2C and 2D, a buffer layer 230' is formed on the anode layer 220, wherein the the buffer layer 230' is formed by, for example, forming a $CF_x$ film (fluorinated carbon film) 230 on the anode layer 220 containing a plurality of carbon-fluoride bonded molecules (not shown in the figure); performing a treatment process 240 on the $CF_x$ film 230 to convert the carbon-fluoride bonded molecules into carbon-carbon bonded molecules (not shown) for forming a carbon-enriched film.

Referring to FIG. 2C, in an embodiment of the present invention, the $CF_x$ film 230 may be formed by using, for example, a plasma chemical vapor deposition (plasma CVD) process including, for example, placing the substrate 210 in a vacuum chamber (not shown in the figure), charging a $CHF_3$ gas (trifluoromethane gas) into the vacuum chamber and applying a voltage between a pair of electrodes (not shown in the figure) for producing a plasma gas containing carbon atoms and fluorine atoms. Next, the plasma gas is diffused onto the anode layer 220, the carbon atoms and the fluorine atoms are aggregated in various proportions to form a $CF_x$ film (fluorinated carbon film) 230 with a plurality of carbon-fluoride bonded molecules.

In particular, the deposition rate of the $CF_x$ film 230 may be carried out at a low deposition rate (LDR) or a high deposition rate (HDR). However, the deposition rate does not affect the film composition. In an embodiment, the above-described carbon-fluoride bonded molecules can be one of $CF_1$ (carbon unifluoride bonded molecule), $CF_2$ (carbon bifluoride bonded molecule), $CF_3$ (carbon trifluoride bonded molecule), C—$CF_n$ (carbon-carbon n-fluoride bonded molecule) and a combination thereof.

Referring to FIG. 2D, in an embodiment, the treatment process 240 includes an ultraviolet irradiation process or a plasma treatment process.

According to an embodiment of the present invention, the ultraviolet irradiation process employs an ultraviolet light with a wavelength of about 180 nm~260 nm, preferably about 185 nm or 254 nm, and a light intensity of about 270 mJ/cm$^2$~810 mJ/cm$^2$ and preferably of about 270 mJ/cm$^2$ or 810 mJ/cm$^2$. Under the above condition, the energy of the ultraviolet breaks the bonded of the carbon-fluoride bonded molecules in the $CF_x$ film 230 and re-bonds the carbon atoms to form carbon-carbon bonded molecules. The composition of the buffer layer 230' as shown in FIG. 2D mostly comprises carbon-carbon bonded molecules.

Since the carbon atom herein possesses sp2 electronic orbital, the electrons are more easy delivered, which renders the buffer layer 230' with an excellent conductivity and can be used as a hole injection layer (HIL) and a hole transporting layer (HTL).

In another embodiment, the treatment process 240 may include a plasma treatment process employing a gas containing argon gas (Ar) or nitrogen gas ($N_2$). In the plasma treatment process, ion bombardment of the argon gas plasma or the nitrogen gas plasma breaks the bonded of the carbon-fluoride bonded molecules in the $CF_x$ film 230 and re-bond the carbon atoms form carbon-carbon bonded molecules.

Figure 2E:
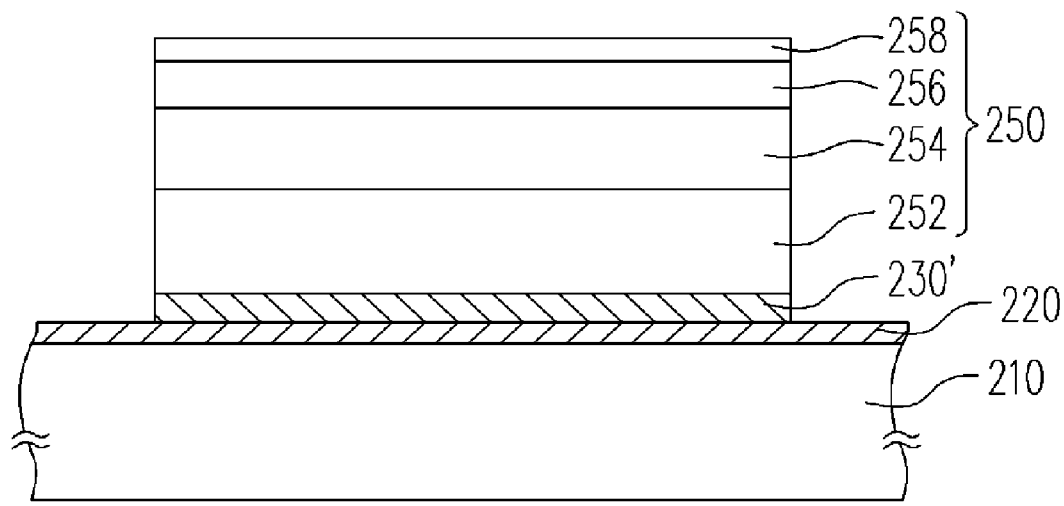

Further, a plurality of organic layers 250 are formed on the buffer layer 230', as shown in FIG. 2E. In an embodiment, the organic layers 250 may be formed by sequentially forming a hole transporting layer (HTL) 252, an organic electroluminescent layer (OEL) 254, an electron transporting layer (ETL) 256 and an electron injection layer (EIL) 258 on the buffer layer 230' by using well known methods including coating, evaporation or sputtering methods.

In an embodiment, the hole transporting layer (HTL) 252 includes NPB (α-naphylhenyidiamine), the organic electroluminescent layer (OEL) 254 includes blended luminescence material doped with $AlQ_3$ (aluminum tris (8-hydroxyquinoline)), the electron transporting layer (ETL) 256 includes $AlQ_3$ (aluminum tris (8-hydroxyquinoline)) and the electron injection layer (EIL) 258 includes LiF (lithium fluoride). However, it should be noted that the present invention is not limit the above materials. Other suitable materials may also be used to achieve the purpose of the present invention, and is construed to be within the scope of the present invention.

Figure 2F:
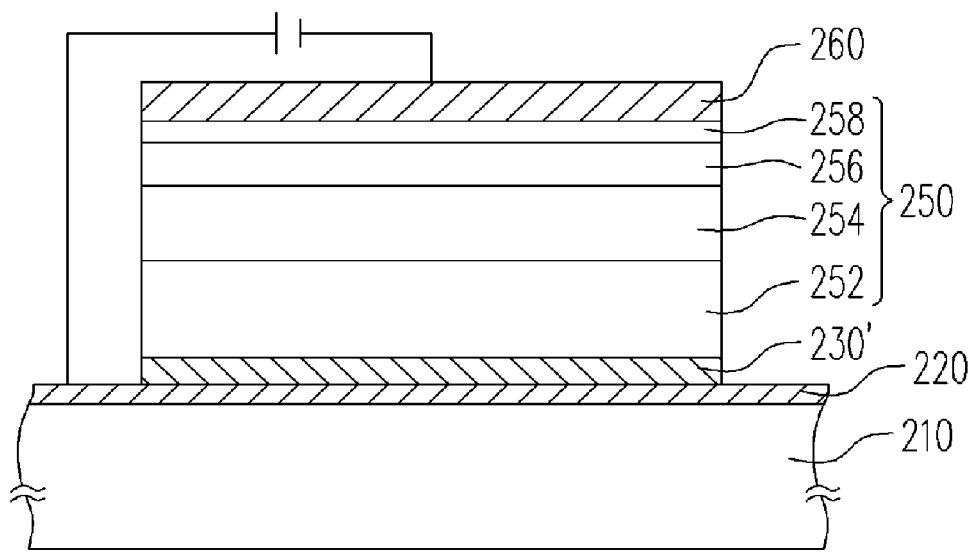

Furthermore, a cathode layer 260 is formed on the organic layer 250, as shown in FIG. 2F. In an embodiment, the cathode layer 260 may be formed by performing a sputtering or an evaporation process. The cathode layer 260 may include a metal or a transparent conductive material, comprising, for example, aluminum, silver or indium tin oxide (ITO).

Thus, an organic electroluminescent device (OLED) 200 of the present invention is obtained, as shown in FIG. 2F. In an embodiment, the organic electroluminescent device (OLED) 200 comprises a stacked structure including the buffer layer 230', the hole transporting layer (HTL) 252, the organic electroluminescent layer (OEL) 254, the electron transporting layer (ETL) 256, the electron injection layer (EIL) 258 and the cathode layer 260, and may be exemplified by C—$C_n$/NPB/C545T+$AlQ_3$/$AlQ_3$/LiF/Al, and the thicknesses of the layers are 3 nm/60 nm/35 nm/15 nm/1 nm/1000 nm, respectively.

Figure 3:
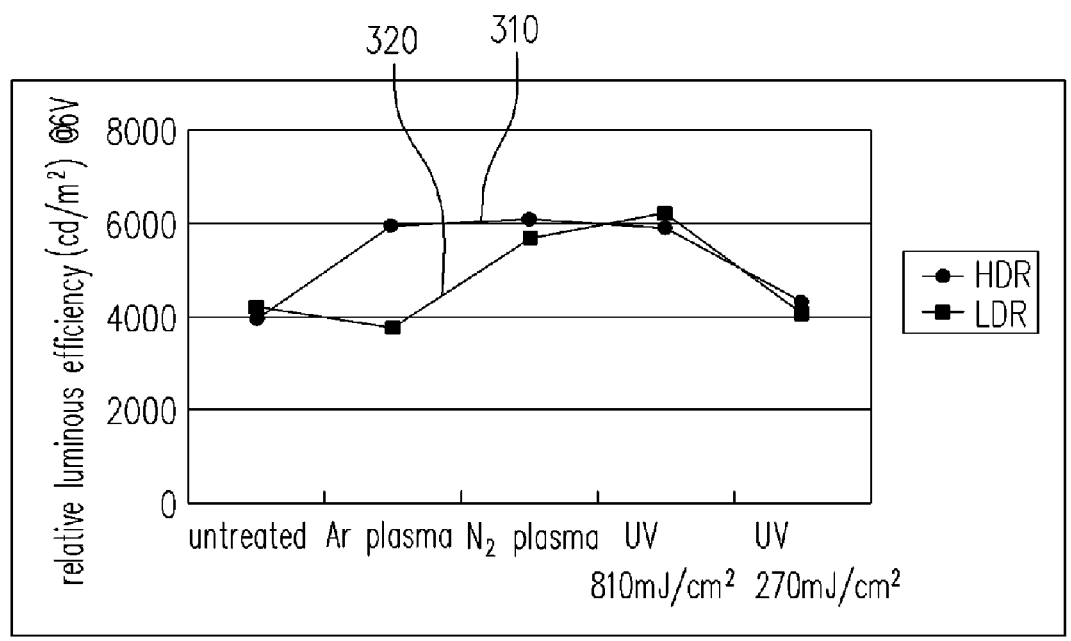
FIG. 3 is a relative luminous efficiency diagram of different organic electroluminescent devices (OLEDs).

To prove that the organic electroluminescent device (OLED) 200 including the buffer layer 230' of the present invention has a better luminous efficiency, OLEDs including a $CF_x$ film 230 not treated by the treatment process 240 and OLEDs including carbon-enriched films were tested for the relative luminous efficiency under an identical testing conditions, for example using the same applied voltage, and the test results are shown in FIG. 3.

FIG. 3 is a relative luminous efficiency measurement of different organic electroluminescent devices (OLEDs). Referring to FIG. 3, a curve 310 represents the relative luminous efficiency of OLEDs comprising a $CF_x$ film formed with a high deposition rate (HDR), while a curve 320 represents the relative luminous efficiency of OLEDs comprising a $CF_x$ film with a low deposition rate (LDR). FIG. 3 also shows relative luminous efficiency measurement of different organic electroluminescent devices (OLEDs) including the buffer layer without being treated with the treatment process and the buffer layer being treated with the treatment process are shown.

As can be seen from the curves 310 and 320 that the OLED comprising a $CF_x$ film without being treated with the treatment process has a relative luminous efficiency of about 4000 $cd/m^2$, whereas the OLED comprising a $CF_x$ film being treated with the treatment process has a greater luminous efficiency as shown in FIG. 3. In particular, as shown by the curve 310 and the curve 320, it is clear that the OLED comprising a CFx film treated with the treatment process 240 including an ultraviolet irradiation process employing an ultraviolet light with a wavelength of 810 $mJ/cm^2$ has the best luminous efficiency, wherein the OLED luminous efficiency is increased by 50% or so.

In summary, by disposing a buffer layer 230' treated with the treatment process 240 between the anode layer 220 and the organic layer 250 of the OLED 200 shown in FIG. 2F, the contact between the anode layer 220 and the organic functional group layer 250 can be improved. According to the present invention, the buffer layer 230' is treated with the treatment process 240 to modify the composition of the buffer layer 230' mainly with carbon-carbon bonded molecules, wherein the carbon atom possesses sp2 electronic orbital, which will deliver the electrons more easily and thereby readily promote conductivity of the buffer layer 230'. Thus, the luminous efficiency of the OLED 200 can be effectively promoted.

Figure 4A:
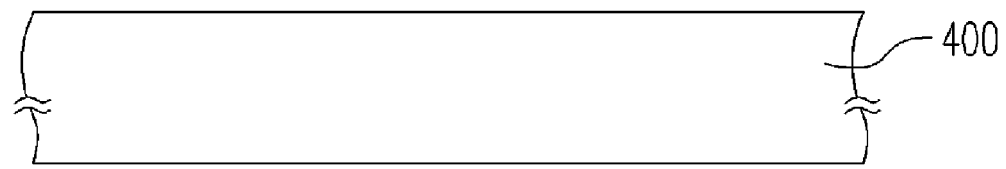
FIG. 4A~FIG. 4C are schematic cross-sectional views showing a method flowchart for fabricating a carbon-enriched film according to an embodiment of the present invention.
Figure 4B:
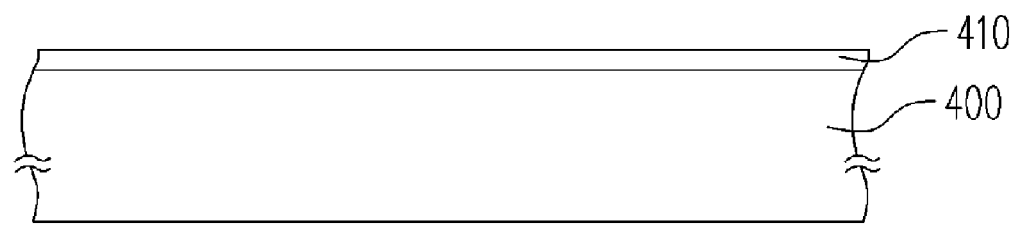
Figure 4C:
Figure 4C:
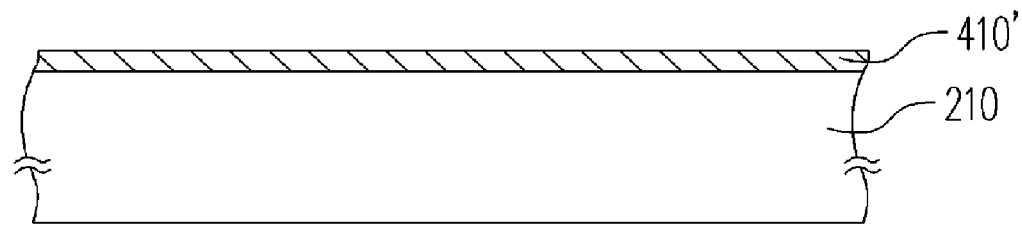

FIG. 4A~FIG. 4C are schematic cross-sectional views showing a flowchart for fabricating a carbon-enriched film according to an embodiment of the present invention.

Referring to FIG. 4A, first, a substrate 400 is provided. In an embodiment, the substrate 400 can be a glass substrate, a plastic substrate or a flexible substrate.

Next, referring to FIG. 4B, a $CF_x$ film (fluorinated carbon film) 410 is formed on the substrate 400. The $CF_x$ film 410 is comprised of a polymeric material having a plurality of carbon-fluoride bonded molecules (not shown in the figure). The $CF_x$ film 410 may be formed by, for example, performing a plasma chemical vapor deposition (plasma CVD) process. Particularly in an embodiment, the above-described carbon-fluoride bonded molecules can be one of $CF_1$ (carbon monofluoride bonded molecule), $CF_2$ (carbon difluoride bonded molecule), $CF_3$ (carbon trifluoride bonded molecule), C—$CF_n$ (carbon-carbon n-fluoride bonded molecule) and a combination thereof.

Thereafter, referring to FIG. 4C, a treatment process 420 is performed on the $CF_x$ film 410, so as to convert the carbon-fluoride bonded molecules into carbon-carbon bonded molecules (not shown) for forming a carbon-enriched film 410'. In an embodiment, the treatment process 420 includes an ultraviolet irradiation process or a plasma treatment process.

Acorrding to an embodiment of the present invention, the ultraviolet irradiation process employs an ultraviolet light having a wavelength of about 180 nm~260 nm, preferably an ultraviolet light having a wavelength of about 185 nm or 254 nm. Furthermore, the light intensity of the UV light is about 270 $mJ/cm^2$~810 $mJ/cm^2$ and preferably, a light intensity of about 270 mJ/cm2 or 810 $mJ/cm^2$. Thus, the $CF_x$ film 410 having carbon-fluoride bonded molecules may be converted into a carbon-enriched film 410' containing carbon-carbon bonded molecules.

Referring to FIG. 4C again, in another embodiment, the treatment process 420 can be the plasma treatment process as well, which employs a gas containing argon (Ar) or nitrogen ($N_2$). The plasma treatment process may be employed for converting carbon-fluoride bonded molecules in the $CF_x$ film 410 into a carbon-enriched film 410' containing carbon-carbon bonded molecules.

According to an embodiment of the present invention, the ultraviolet irradiation process provides a better effect in converting the carbon-fluoride bonded molecules in the $CF_x$ film 410 into a carbon-enriched film 410' containing carbon-carbon bonded molecules. An X-ray photoelectron spectrometer (XPS) may be used to measure the molecule composition of the $CF_x$ film 410 before subjecting the $CF_x$ film 410 to the treatment process 420 and the molecule composition of the carbon-enriched film 410' obtained after treating the $CF_x$ film 410 with the treatment process 420, and the results are shown in FIGS. 5A and 5B.

Figure 5A:
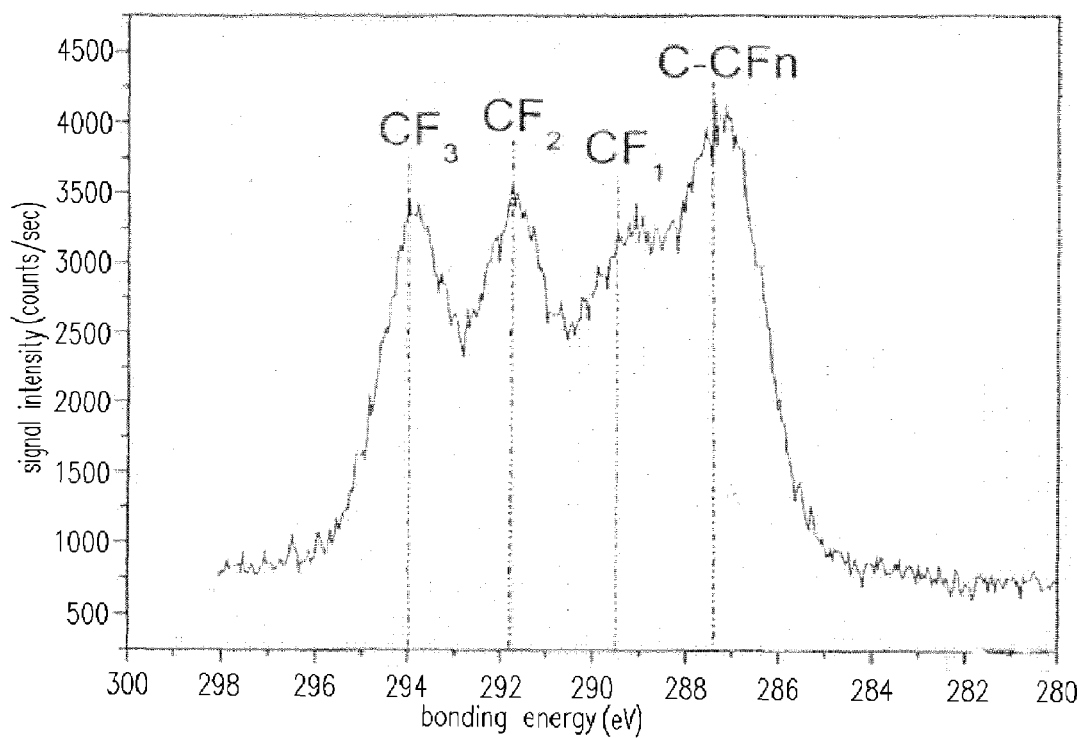
FIG. 5A is an X-ray photoelectron spectrogram of the $CF_x$ film (fluorinated carbon film) prior to being treated.
Figure 5B:
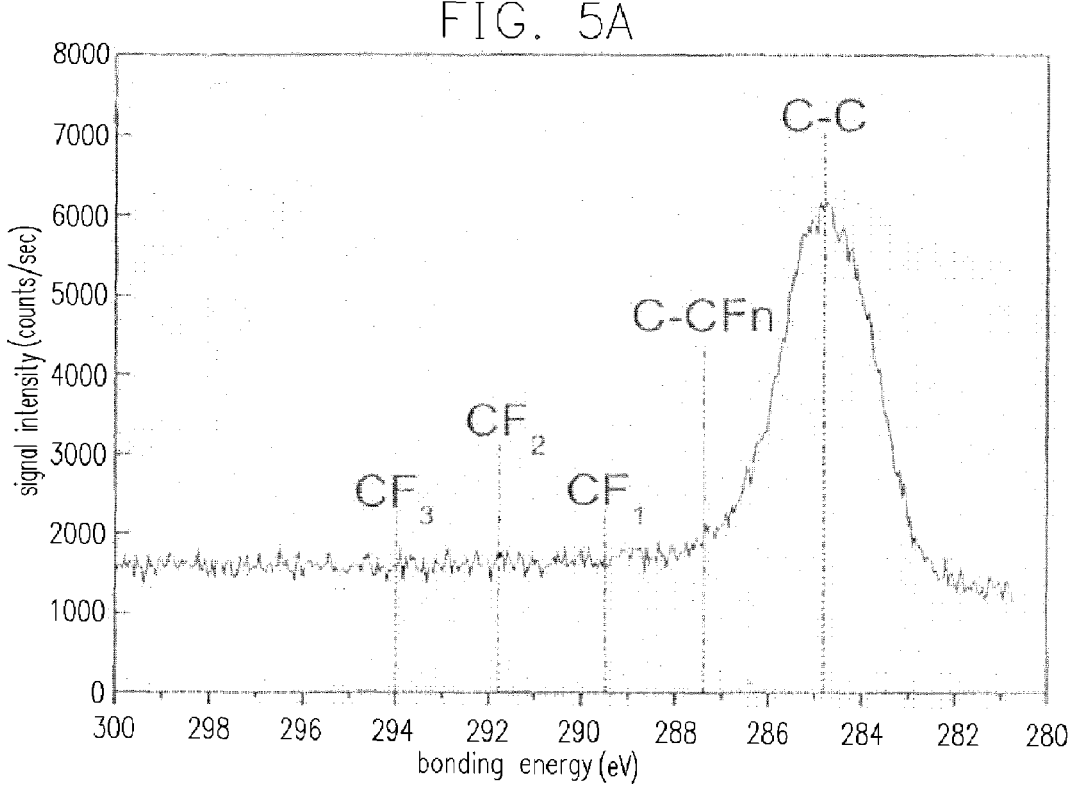
FIG. 5B is an X-ray photoelectron spectrogram of the $CF_x$ film (fluorinated carbon film) after being treated.

FIG. 5A is an X-ray photoelectron spectrogram of the $CF_x$ film (fluorinated carbon film) before being subjected to the treatment process 420. FIG. 5B is an X-ray photoelectron spectrogram of the $CF_x$ film (fluorinated carbon film) after being subjected to the treatment process. Referring to FIG. 5A, the noticeable signals of $CF_1$, $CF_2$, $CF_3$ and $C-CF_n$ appearing on the X-ray photoelectron spectrogram (XPS spectrogram) indicate that the composition of the $CF_x$ film 410 before being treated mainly contains $CF_1$, $CF_2$, $CF_3$ and $C-CF_n$. bonded molecules. Referring to FIG. 5B, it can be seen that after being treated by the treatment process 420, in particular after the ultraviolet irradiation process, all signals of carbon-fluoride bonded molecules are almost disappeared on the XPS spectrogram. Instead, the signal of the carbon-carbon bonded molecules is apparent, indicating the carbon-enriched film 410' obtained after the treatment contains carbon-carbon bonded molecules mainly.

Since the carbon atom herein possesses sp2 electronic orbital, the carbon-enriched film 410' has an excellent electrical conductivity. The carbon-enriched film 410' may also be used to serve as a hole injection layer (HIL) and a hole transporting layer (HTL) in the OLED. Thus, the OLED luminous efficiency can be effectively promoted. In addition, the above-described method for fabricating the carbon-enriched film is simple and the carbon-enriched film 410' also has a better thermal stability.

In summary, the method for fabricating the OLED and the method for fabricating the carbon-enriched film of the present invention has at least the following advantages:

(1) The OLED of the present invention employs a carbon-enriched film with high conductivity as a buffer layer, which is capable of promoting the OLED luminous efficiency.

(2) The method for fabricating the carbon-enriched film is simple, wherein an ultraviolet irradiation process may be employed to convert the $CF_x$ film into the carbon-enriched film containing carbon-carbon bonded molecules.

(3) The carbon-enriched film mainly contains carbon-carbon bonded molecules, and therefore, the carbon-enriched film has a better conductivity and a better thermal stability.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A method for fabricating an organic electroluminescent device (OLED), comprising:
   providing a substrate;
   forming an anode layer on the substrate;
   forming a buffer layer on the anode layer, wherein the buffer layer comprises a fluorinated carbon film containing carbon-fluoride bonded molecules;
   performing a treatment process on the fluorinated carbon film to convert the carbon-fluoride bonded molecules into carbon-carbon bonded molecules to form a carbon-enriched film, wherein carbon atoms in the carbon-enriched film possess $sp^2$ electronic orbital;
   forming a plurality of organic layers on the carbon-enriched film; and
   forming a cathode layer on the organic layers.

2. The method for fabricating an OLED as recited in claim 1, wherein the treatment process comprises an ultraviolet irradiation process or a plasma treatment process.

3. The method for fabricating an OLED as recited in claim 2, wherein the ultraviolet irradiation process employs an ultraviolet light with a wavelength of about 180 nm~260 nm.

4. The method for fabricating an OLED as recited in claim 3, wherein the wavelength of the ultraviolet light is about 185 nm or 254 nm.

5. The method for fabricating an OLED as recited in claim 2, wherein the ultraviolet irradiation process employs an ultraviolet light with an intensity of about 270 mJ/cm2~810 mJ/cm2.

6. The method for fabricating an OLED as recited in claim 5, wherein the light intensity of the ultraviolet light is about 270 $mJ/cm^2$ or 810 $mJ/cm^2$.

7. The method for fabricating an OLED as recited in claim 2, wherein the gas the plasma treatment process employs a gas containing argon (Ar) or nitrogen ($N_2$).

8. The method for fabricating an OLED as recited in claim 1, wherein the carbon-fluoride bonded molecules includes one of $CF_1$ (carbon monofluoride bonded molecule), $CF_2$ (carbon bifluoride bonded molecule), $CF_3$ (carbon trifluoride bonded molecule), $C-CF_n$ (carbon-carbon n-fluoride bonded molecule) and a combination thereof.

9. The method for fabricating an OLED as recited in claim 1, wherein the fluorinated carbon film is formed by performing a plasma chemical vapor deposition process.

10. The method for fabricating an OLED as recited in claim 1, wherein the buffer layer comprises a hole injection layer (HIL) and a hole transporting layer (HTL).

11. The method for fabricating an OLED as recited in claim 1, wherein the method for forming the organic layer on the buffer layer comprises sequentially forming a hole transporting layer (HTL), an organic electroluminescent layer (OEL), an electron transporting layer (ETL) and an electron injection layer (EIL) over the buffer layer.

12. The method for fabricating an OLED as recited in claim 11, wherein the hole transporting layer (HTL) comprises NPB (.-naphylhenyldiamine).

13. The method for fabricating an OLED as recited in claim 11, wherein the organic electroluminescent layer (OEL) comprises a blended luminescence material doped with AlQ3 (aluminum tris (8-hydroxyquinoline)).

14. The method for fabricating an OLED as recited in claim 11, wherein the electron transporting layer (ETL) comprises $AlQ_3$ (aluminum tris (8-hydroxyquinoline)).

15. The method for fabricating an OLED as recited in claim 11, wherein the electron injection layer (EIL) comprises LiF (lithium fluoride).

16. The method for fabricating an OLED as recited in claim 1, wherein the anode layer comprises metal or transparent conductive material.

17. The method for fabricating an OLED as recited in claim 1, wherein the cathode layer comprises metal or transparent conductive material.

* * * * *